United States Patent
Bhakta

(10) Patent No.: US 6,500,774 B1
(45) Date of Patent: Dec. 31, 2002

(54) METHOD AND APPARATUS FOR AN INCREASED THROUGHPUT FURNACE NITRIDE BARC PROCESS

(75) Inventor: Jayendra D. Bhakta, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 12 days.

(21) Appl. No.: 09/608,003

(22) Filed: Jun. 30, 2000

(51) Int. Cl.[7] .................. H01L 21/31; H01L 21/469; H01L 21/4763
(52) U.S. Cl. .................. 438/791; 438/618; 438/636
(58) Field of Search .................. 438/618, 634, 438/636, 680, 694, 791, 792

(56) References Cited

U.S. PATENT DOCUMENTS

| | | | | |
|---|---|---|---|---|
| 5,968,611 A | * | 10/1999 | Kaloyeros et al. | 427/579 |
| 6,017,144 A | * | 1/2000 | Guo et al. | 364/468.28 |
| 6,291,363 B1 | * | 9/2001 | Yin et al. | 438/769 |
| 6,294,459 B1 | * | 9/2001 | Yin et al. | 438/636 |
| 6,326,321 B1 | * | 12/2001 | DeBoer | 438/791 |

* cited by examiner

Primary Examiner—Alexander Ghyka
(74) Attorney, Agent, or Firm—Foley & Lardner

(57) ABSTRACT

Embodiments of the invention comprise a new device and technique to realize an improved throughput of a BARC layer furnace deposition device. This improvement is achieved by providing for a higher flow rate of $NH_3$ during the BARC deposition process. Also, this improvement may be achieved by reducing the temperature gradient of the BARC layer furnace deposition device to approximately 715–750° C. For example, approximately a 1–10% blend of $NH_3$ in at least one of Argon, Nitrogen, and Helium is utilized. By diluting the $NH_3$, a higher flow rate may be utilized in the furnace deposition device, thus allowing for an increased load uniformity of the BARC layer thickness, refractive index, extinction coefficient, and reflectivity characteristics. Also, the $NH_3$ depletion is reduced and preferably eliminated due to the higher flow rate of the diluted $NH_3$. Further, this diluted $NH_3$ allows for a reduced DCS requirement, thus reducing maintenance requirements, exhaust component contamination and allowing for a lowering of the particulates. The diluted $NH_3$ is preferably supplied at approximately 200–500 SCCM, and the DCS flow rate is reduced to approximately 100–150 SCCM, at a pressure of approximately 200–350 mTorr.

18 Claims, 3 Drawing Sheets

METHOD AND APPARATUS FOR AN INCREASED THROUGHPUT FURNACE NITRIDE BARC PROCESS

BACKGROUND OF THE INVENTION

The present invention relates generally to an integrated circuit ("IC"). More specifically, this invention relates to the fabrication of an integrated circuit having an improved method and apparatus for an increased throughput furnace nitride bottom anti-reflective coating ("BARC") process.

DESCRIPTION OF THE PRIOR ART

The present invention applies particularly to the fabrication of logic devices and integrated circuits. Some examples of integrated circuits include an EPROM, an EEPROM, a flash memory device, and a complementary metal oxide silicon ("CMOS") type device. An exemplary device may comprise a field-effect transistor ("FET") containing a metal gate over thermal oxide over silicon ("MOSFET"), as well as other ultra-large-scale integrated-circuit ("ULSI") systems.

Integrated circuits are utilized in a wide variety of commercial and military electronic devices, including, e.g., hand held telephones, radios and digital cameras. The market for these electronic devices continues to demand devices with a lower voltage, a lower power consumption and a decreased chip size. Also, the demand for greater functionality is driving the "design rule" lower, for example, into the sub-half micron range. The sub-half micron range may comprise, e.g., decreasing from a 0.35–0.25 micron technology to a 0.18 micron or a 0.15 micron technology, or even lower.

In fabricating a conventional circuit cell, polysilicon is preferably used for a conductive layer formation. The conductive layer is utilized to form a gate structure. In defining a conventional gate structure, polysilicon is first deposited upon a substrate. Next, a BARC layer is formed over the polysilicon. Then a photoresist layer is spun onto the BARC layer.

In order to form the conventional BARC layer, an Si-rich Nitride process is utilized to deposit the BARC layer in a furnace environment. However, for the conventional BARC process, a full furnace load cannot be utilized due to a process variation from the top to the bottom of the furnace deposition device. Thus, an inefficiency is caused in the production of semiconductor devices, because the full physical capacity of the furnace deposition devices cannot be utilized.

For example, in a conventional furnace deposition, a pressure of 100–600 mTorr is utilized. A conventional gas flow comprises ammonia ("$NH_3$") at a flow rate of 10–30 SCCM and Dichlorosilane ("DCS") ($SiH_2Cl_2$) at 300–450 SCCM. Conventionally, the furnace deposition experiences a temperature in a first or top zone of 750–770° C., a second or center zone temperature of 720–730° C., and a third or bottom zone of 700–720° C. Conventionally, the top, center and bottom zones comprise approximately equal volumetric divisions of the furnace deposition device.

Because of the relatively low concentrations of $NH_3$ utilized in the conventional BARC layer furnace deposition process, it is relatively difficult to obtain a uniform quality of the semiconductor devices if the entire furnace device is loaded, i.e., if the entire volume available is utilized or filled with a complete load of semiconductor devices, or wafers, to be coated with a BARC layer.

For example, if the device is utilized at a full load rate, then the thickness, the refractive index ("RI"), the extinction coefficient ("k") and the reflectivity are degraded. Also, the temperature gradient across the furnace deposition device causes problems with the uniformity of these factors and thus causes problems with uniformity of the deposition of the BARC layer across all of the full load of wafers. Thus, a reduced load is run in the device so as to avoid the extremes of temperature, e.g., in the upper portions of the top zone and lower portion of the bottom zone. This reduced load, in turn, allows for a more uniform deposition of the BARC layer.

One solution conventionally practiced is to utilize a high, i.e., an excessive, flow rate of DCS in order to attempt to maintain load uniformity. However, utilizing these excessive DCS flow rates may cause, for example, a buildup of more byproducts on the exhaust components. Thus, not only is a full load not presently able to be utilized within the furnace deposition devices, but when nearly a full load is utilized with excessive flow rates of DCS, the maintenance requirements of the exhaust components becomes a problem. Also, with excessive DCS, an increased problem with particulates is encountered.

What is needed is a device and method for improving the throughput of a BARC layer furnace deposition device. What is also needed is a device and method for improving the ability of the BARC layer furnace deposition device to operate with a relatively reduced DCS flow. What is also needed is a device and method for improving the ability of the BARC layer furnace deposition device to operate with a reduced temperature gradient across the furnace device. What is also needed is a device and method for improving the maintenance and/or reducing the exhaust components and/or reducing the particulates of a BARC layer furnace deposition device.

SUMMARY OF THE INVENTION

Embodiments of the present invention are best understood by examining the detailed description and the appended claims with reference to the drawings. However, a brief summary of embodiments of the present invention follows.

Briefly described, an embodiment of the present invention comprises a device and a method that provides for an improved throughput of a BARC layer furnace deposition device. This improvement is achieved by providing for a higher flow rate of $NH_3$ during the BARC deposition process. Also, this improvement may be achieved by reducing the temperature gradient of the BARC layer furnace deposition device to approximately 715–750° C.

For example, $NH_3$ diluted in at least one of Argon, Nitrogen, and Helium, e.g., approximately a 1–10% blend of $NH_3$ in Ar, may be utilized. By diluting the $NH_3$, a higher flow rate may be utilized in the furnace deposition device, thus allowing for an increased load, and uniformity of the BARC layer thickness, refractive index, extinction coefficient, and reflectivity characteristics.

Also, the $NH_3$ depletion is reduced and preferably eliminated due to the higher flow rate of the diluted $NH_3$. Further, this diluted $NH_3$ allows for a reduced DCS requirement, thus reducing maintenance requirements, exhaust component contamination, and also allows for a lowering of the particulates. The diluted $NH_3$ is preferably supplied at approximately 200–500 SCCM, and the DCS flow rate is preferably reduced to approximately 100–150 SCCM, at a pressure of approximately 100–600 mTorr and may also be supplied within a more narrow range of 200–350 mTorr.

BRIEF DESCRIPTION OF THE DRAWINGS

Embodiments of the present invention are described in detail herein with reference to the drawings in which.

The accompanying drawings, wherein like numerals denote like elements, are incorporated into and constitute a part of the specification, and illustrate presently preferred exemplary embodiments of the invention. However, it is understood that the drawings are for the purpose of illustration only, and are not intended as a definition of the limits of the invention. Thus, the drawings, together with the general description given above, and the detailed description of the preferred embodiments given below, together with the appended claims, serve to explain the principles of the invention.

DETAILED DESCRIPTION OF THE PREFERRED EMBODIMENT

An embodiment of the present invention is illustrated utilizing an integrated circuit device. FIGS. 1–8 illustrate various techniques in the practice of the embodiments of the present invention. It will be understood by one skilled in the art that various components of the present invention as illustrated in FIGS. 1–8 are not shown in order to simplify the illustrations.

Figure 1:
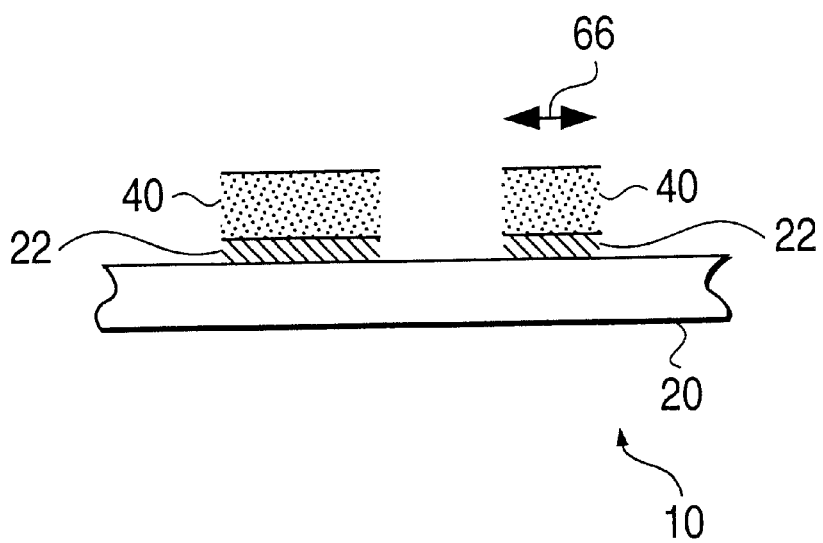
FIG. 1 illustrates a cross-sectional representation of a portion of a polysilicon gate structure of a circuit device in accordance with the principles of an embodiment of the present invention.

FIG. 1 illustrates a cross-sectional view of a circuit device 10 that is comprised of a substrate 20. However, the respective source and drain regions are not shown. A gate oxide layer 22 is formed over the substrate 20. A first conductive layer, i.e., a polysilicon layer, 40 is then formed over the gate oxide layer 22. The first conductive layer 40 may be patterned, for example, by masking and etching. It is understood by one skilled in the art that additional steps in the formation of a logic device have been omitted for clarity, for example, a formation of a barrier layer, e.g., a silicon Nitride SN ("SN") such as $Si_3N_4$. Also illustrated in FIG. 1 is an exemplary indication of a line width portion 66 of the first conductive layer 40 for formation into a gate structure.

The method of forming the structure shown in FIG. 1 will now be described with reference to FIGS. 2–8.

Figure 2:
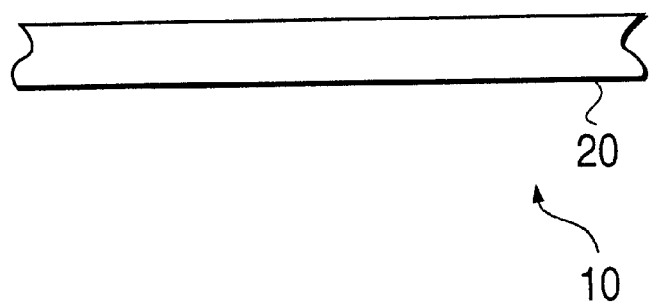
FIG. 2 illustrates a portion of the polysilicon gate structure of FIG. 1, that comprises a substrate formation, in accordance with the principles of an embodiment of the present invention.
Figure 3:
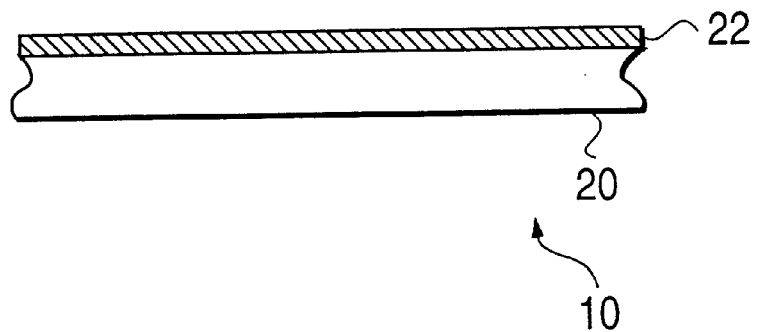
FIG. 3 illustrates a portion of the polysilicon gate structure of FIG. 1, that comprises a gate $SiO_2$ layer formation, in accordance with the principles of an embodiment of the present invention.

First, as shown in FIG. 2, a substrate 20 is provided upon which the circuit device 10 will be fabricated. Next, as shown in FIG. 3, a gate layer, e.g., a gate oxide layer 22 that may comprise, e.g., $SiO_2$ at a thickness preferably of approximately 10–150 Angstroms is formed. The gate layer or gate oxide layer 22 is grown upon the silicon substrate 20. This gate oxide layer may also comprise, e.g., a pad oxide, again, such as $SiO_2$, that may be grown over the substrate 20. The oxide layer may be grown, for example, at a thickness of between 100–500 Angstroms. However, in this exemplary embodiment the oxide layer is grown to about 150 Angstroms in thickness. In another arrangement of the present invention, the thickness of the gate oxide layer 22 may be between approximately 10–150 Angstroms, and the thickness is preferably about 100 Angstroms.

Figure 4:
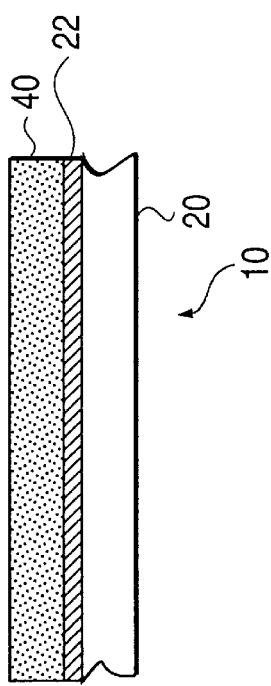
FIG. 4 illustrates a portion of the polysilicon gate structure of FIG. 1, that comprises a first conductive layer formation, in accordance with the principles of an embodiment of the present invention.

Then, as illustrated in FIG. 4, a first conductive layer 40 that preferably comprises polysilicon is formed upon the gate oxide layer 22. In one arrangement of the present invention, the thickness of the gate oxide layer 22 may be between approximately 10–50 Angstroms, and the thickness is preferably about 35 Angstroms.

In an exemplary embodiment, the first polysilicon conductive layer 40 may be deposited at a temperature of approximately 620° C., utilizing a gas comprising $SiH_4$ that is provided at a flow rate of approximately 300 SCCM. The first polysilicon conductive layer 40 is preferably deposited at a pressure of approximately 200 mTorr, and is preferably formed at an approximate thickness of between 1200–1600 Angstroms.

Of course, it is understood by one skilled in the art that various embodiments of the instant invention may comprise alternately, for example, a shallow trench isolation ("STI") arrangement, or alternately may comprise a metal oxide semiconductor field effect transistor ("MOSFET"), a memory cell and other alternate devices. Also, as is clear from the detailed description herein, together with the drawings, embodiments of the present invention may be practiced by utilizing CMOS processes.

In alternate embodiments of the present invention, the term "substrate" may include a silicon-based substrate 20 as shown in FIGS. 1–8 or, e.g., a doped silicon, a gallium arsenide (GaAs), a gallium arsenide phosphide (GaAsP), a germanium, or a silicon germanium (SiGe) substrate. The "substrate" may also include any underlying material or materials that may be utilized, or upon which a device, a circuit, or an epitaxial layer may be formed. In other alternative embodiments, this "substrate" may include, for example, a tunnel oxide layer, or more generally any $SiO_2$ or Nitride, e.g., $Si_3N_4$, layer in addition to the semiconductor substrate portion 20. For example, in some embodiments, the substrate 20 may also comprise the $T_{ox}$ layer 22, while in other embodiments, the substrate 20 is considered to be separate from the $T_{ox}$ layer 22. In this regard, the term "substrate" is being utilized to generally define the elements for layers that underlie a layer or portions of interest. Also, the "substrate" may be a superconductor base or any other base on which a layer is formed, for example, a metal layer.

Figure 5:
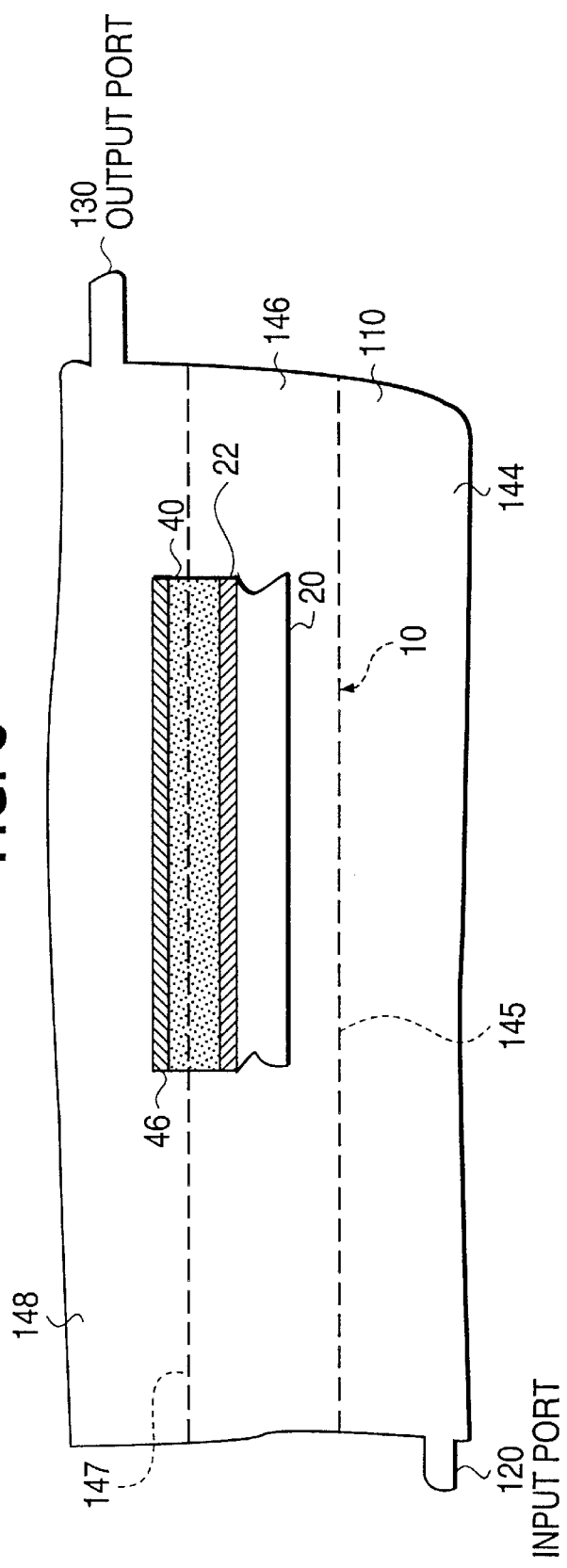
FIG. 5 illustrates a portion of the polysilicon gate structure of FIG. 1, that comprises a BARC layer formation in accordance with the principles of an embodiment of the present invention.

Next, as shown in FIG. 5, a BARC layer 46 is formed upon the first polysilicon conductive layer 40 of the semiconductor device 10. Also, as illustrated in FIG. 5, the semiconductor device is placed within a block diagram representation of a furnace deposition device 110. The furnace deposition device has an input port 120 and an output port 130 for introducing and exhausting the gases utilized as a portion of the BARC layer deposition process.

In a preferred embodiment of the present invention as illustrated in FIG. 5, a diluted $NH_3$ mixture is introduced to the furnace deposition device 110 at the input port 120. The diluted $NH_3$ mixture has first been diluted preferably in Ar, so as to form an approximately one percent to ten percent $NH_3$ to Ar blend. Further, in other alternate embodiments, the $NH_3$ may be diluted in alternate solutions, e.g., preferably an inert gas such as $N_2$ or He, rather than utilizing Ar.

The diluted $NH_3$ is introduced at a higher flow rate than for a conventional BARC layer deposition process. For example, in one preferred arrangement, the $NH_3$ may be provided at a flow rate of approximately 200 to 500 SCCM. In another alternate embodiment, the diluted $NH_3$ mixture may be provided at an even lower flow rate, e.g., 150 SCCM, or even lower. In yet another alternate arrangement, the diluted $NH_3$ mixture may be provided at an even higher flow rate, e.g., well above 500 SCCM, e.g., 500–750 SCCM, or even higher. However, these higher flow rates are preferably only utilized at a dilution of less than 1% $NH_3$ mixture.

In another alternate arrangement, this mixture may be approximately a 5% $NH_3$ mixture or less, e.g., a 1% to 5% $NH_3$ solution in Ar. In a preferred arrangement, approximately inclusively a 1% to 2% solution of $NH_3$ in Ar may be utilized. It is understood that the dilution range of $NH_3$ is not limited to 1% to 10%. Instead, the dilution percent of $NH_3$ may be higher than 10%, and/or may be significantly lower than 1%, e.g., 0.1%, and still achieve an improved BARC layer. Of course, if the diluted $NH_3$ is significantly lower than 1%, e.g. 0.1%, then the flow rate and/or the pressure are adjusted upwardly as described above to compensate for the relatively low concentration of $NH_3$.

Also, in combination with a preferred 1–2% diluted $NH_3$ at 200–500 SCCM, a DCS gas is supplied at a relatively low flow rate of approximately 100 to 150 SCCM. When the diluted $NH_3$ and the DCS gasses are supplied, the furnace deposition device 110 is preferably maintained at a pressure of approximately 200 to 350 mTorr. In an alternate arrangement, the pressure may be maintained at approximately 100–600 mTorr. The bottom anti-reflective coating may be formed to a thickness of between approximately 100 to 600 Angstroms, and is preferably formed to a thickness of between approximately 150 to 250 Angstroms.

The temperature of the furnace deposition device 110 is maintained so as to provide a temperature range of approximately 715 to 750° C. More specifically, in a preferred embodiment as shown in FIG. 5, a top zone 148 comprises approximately a 740 to 750° C. environment, the center zone 146 comprises a 725 to 730° C. environment, and a bottom zone 144 comprises approximately a 715 to 725° C. environment.

In one arrangement, the top zone 148, the center zone 146, and the bottom zone 144 portions of the furnace deposition device 110 each comprise approximately one-third of the volume of the furnace deposition device 110. However, in alternate arrangements, the top, center and bottom zones 148, 146, and 144, are not necessarily equal in volume, nor in vertical thickness. A vertical thickness, for example, may be illustrated as the distance between the top zone boundary 147 and the bottom zone boundary 145, the distance therebetween comprising an approximate exemplary thickness of the center zone 146, as illustrated in FIG. 5.

A portion of the improvement of the BARC layer deposition of the present invention includes the ability to utilize a relatively smaller amount of $NH_3$. This is different than a conventional process that utilizes a relatively smaller amount of $NH_3$ and a larger amount of DCS. This difference results because the $NH_3$, in a conventional process, becomes a limiting free agent. This is because the $NH_3$ is conventionally initially injected from approximately the area of the bottom zone 144, and by the time the $NH_3$ reaches the semiconductor devices located in the top zone 148 the $NH_3$ is in a depleted state. This results in a lack of uniformity in a deposition of a BARC layer in a conventional furnace deposition device.

Quite differently, the instant invention instead provides for utilization of preferably a significantly diluted $NH_3$ mixture as described above.

By providing a diluted $NH_3$ mixture, at an increased flow rate, the building of the BARC layer is performed at a slower rate. Thus, the $NH_3$ gas does not deplete in the same manner as it moves from zone to zone, because it is already at a 1% state and the flow rate is significantly increased. Thus, a greater uniformity of the BARC layer is achieved on the semiconductor devices. Further, this allows the BARC layer to achieve a more uniform thickness, refractive index, extinction coefficient properties, and reflectivity characteristics than may be realized in the prior art.

The extinction coefficient ("k") is equal to the sum of the absorption coefficient and the scattering coefficient. Thus, the extinction coefficient is an indicator for the law or rule that indicates the characteristics of the BARC layer, as to how the BARC layer is actually absorbing the ultraviolet light that is utilized to later expose the photoresist layer. In other words, this extinction coefficient or image component indicates how much of the ultraviolet light is being absorbed versus how much of the light is being reflected away and thus not being absorbed.

More specifically, the reflection coefficient ("R") is the fraction of the incident light that is reflected back from the substrate. For light going from a first medium (1) to a second medium (2), the reflection coefficient is given by the following expression:

$$R=(n_1-n_2/n_1+n_2)^2$$

Here, $n_1$ and $n_2$ are the complex refractive indices of the first medium (1) and the second medium (2), such that $n_1=n_1-ik_1$, and $n_2=n_2-ik_2$. Thus, $n_1$ and $n_2$ are the real parts of the refractive indices, while $k_1$ and $k_2$ are the extinction coefficients of the first medium (1) and the second medium (2), respectively. Also, k is directly related to the absorption coefficient by the following expression:

$$\alpha=4\pi k/\lambda$$

where $\lambda$ is the wavelength of light in vacuum.

The amount of reflectivity or absorption of light of the BARC layer and the photoresist layer is important as it is utilized in essentially the most critical portion of the fabrication process, namely, the masking and patterning of the polysilicon layer.

While in FIGS. 1–8 a first or single polysilicon conductive layer 40 is illustrated, this same device and method may be utilized for any number of polysilicon layers, and/or any other adaptation of semiconductor fabrication that may require a BARC layer deposition.

Thus, an improved control of the critical dimensions of the fabrication process, including control of the physical dimensions and the photolithography process may be better achieved by this BARC layer furnace deposition device and method. Also, by improving the BARC layer, a better margin of tolerance is provided in the photolithography and critical dimension formation process.

Figure 6:
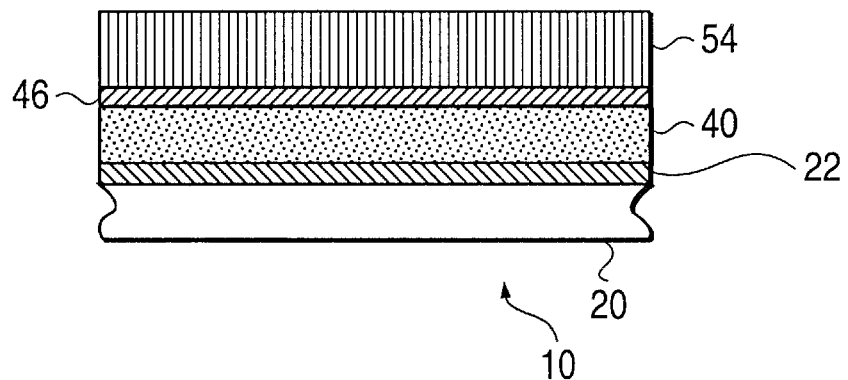
FIG. 6 illustrates a portion of the polysilicon gate structure of FIG. 1, that comprises a photoresist layer formation, in accordance with the principles of an embodiment of the present invention.

Next, as shown in FIG. 6, some remaining conventional steps are illustrated. Next, the photoresist layer 54 is spun onto the BARC layer 46 of the semiconductor device 10 as illustrated in FIG. 6.

Figure 7:
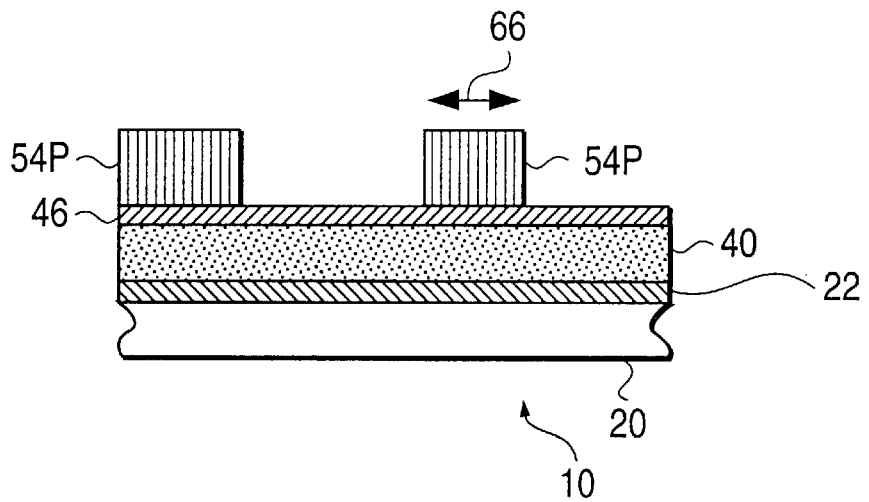
FIG. 7 illustrates a portion of the polysilicon gate structure of FIG. 1, that comprises a removal of a portion of the photoresist layer, in accordance with the principles of an embodiment of the present invention.
Figure 8:
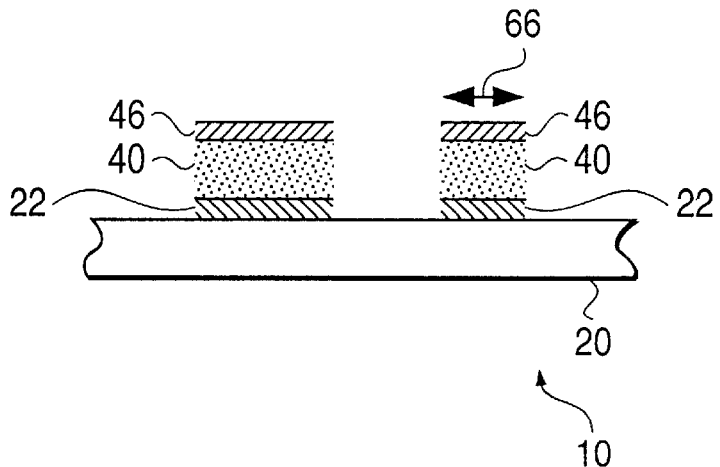
FIG. 8 illustrates a portion of the polysilicon gate structure of FIG. 1, that comprises a removal of portions of the gate $SiO_2$ layer, the first conductive layer, and the BARC layer, in accordance with the principles of an embodiment of the present invention.

Then as illustrated in FIG. 7, the photoresist layer 54 is exposed to ultraviolet light and developed so as to form a pattern upon the BARC layer 46 of the semiconductor device 10 as shown in FIG. 7. The photoresist portions 54P are formed after an exposure to preferably a deep ultraviolet and developing process that is known in the art. The photoresist portions 54P will then allow the undesired portions of the BARC layer 46, the first polysilicon conductive layer 40 and the gate oxide layer 22 to be removed preferably by a selective etching process that is known in the art. Thus, upon performing a selective etching, the circuit device 10 is formed as shown in FIG. 8. As also shown in FIGS. 7 and 8, as well as FIG. 1, an exemplary representation of a line width portion 66 is shown for clarity.

As shown in FIG. 8, the BARC layer 46 portions are still retained on the remaining portions of the first polysilicon conductive layer 40 and the gate oxide layer 22 layers that form a portion of the gate element of the circuit device 10.

Finally, the remaining BARC layer 46 portions are removed as illustrated in FIG. 1, so as to prepare the first polysilicon conductive layer 40 for further fabrication.

Any additional steps in the formation of the exemplary circuit device 10, e.g., a second conductive layer (if desired) gate patterning, are not shown for clarity.

Thus, embodiments of the present invention may comprise a device and method for improving the ability to form a BARC layer and for an improved throughput for a BARC furnace process and technique. Embodiments of the present invention may also provide a device and method for improving the throughput of a BARC layer furnace deposition device. Embodiments of the present invention may also provide a device and method for improving the ability of the BARC layer furnace deposition device to operate with a reduced DCS flow. Further, embodiments of the present invention may provide a device and method for improving the ability of the BARC layer furnace deposition device to operate with a reduced temperature gradient across the furnace device. Finally, embodiments of the present invention may provide a device and method for improving the maintenance and/or reducing the exhaust components and/or reducing the particulates of a BARC layer furnace deposition device.

The invention has been described in reference to particular embodiments as set forth above. However, only the preferred embodiments of the present invention, and several examples of its versatility are shown and described in the present disclosure. It is to be understood that the present invention is capable of use in various other combinations and environments, and is capable of changes or modifications within the scope of the inventive concept as expressed herein. Also, many modifications and alternatives will become apparent to one of skill in the art without departing from the principles of the invention as defined by the appended claims.

What is claimed is:

1. A method of forming a silicon nitride layer for utilization in the fabrication of a semiconductor device, comprising the steps of:
   inserting the semiconductor device into a furnace device, and
   forming the silicon nitride layer over the semiconductor device by:
      providing the furnace device with a first feed gas comprising ammonia that is carried by a mixture gas such that the ammonia comprises no more than approximately 10% of the first feed gas, and
      providing the furnace device with a second feed gas comprising dichlorosilane in a proportion to the ammonia for forming silicon nitride,
   the presence of the mixture gas in the first feed gas providing an increased gas flow rate in the furnace device that increases uniformity of silicon nitride thickness on the semiconductor device and reduces a temperature gradient within the furnace device.

2. A method as recited in claim 1, further comprising the steps of:
   providing the first feed gas at a flow rate of at least approximately 200 SCCM, and at a pressure of more than approximately 100 mTorr, and
   providing the second feed gas at a flow rate of at least approximately 100 SCCM.

3. A method as recited in claim 2, further comprising the step of:
   providing the first feed gas at a pressure of less than approximately 600 mTorr.

4. A method as recited in claim 1, further comprising the step of:
   operating the furnace device at a temperature range between approximately 715° C. and 750° C., when the first and second feed gases are provided to the furnace unit.

5. A method as recited in claim 1, further comprising the steps of:
   operating the furnace device at a temperature range between approximately 715° C. and 750° C., when the first and second feed gases are provided to the furnace unit,
   providing the first feed gas at a flow rate of less than approximately 500 SCCM, and at a pressure of less than approximately 350 mTorr, and
   providing the second feed gas at a flow rate that is less than approximately 150 SCCM.

6. A method as recited in claim 1, further comprising the steps of:
   prior to forming the silicon nitride layer, forming a conductive layer over a substrate of the semiconductor device, and
   forming the silicon nitride layer over the conductive layer, wherein
   the silicon nitride layer comprises an anti-reflective coating.

7. A method as recited in claim 1, wherein
   the mixture gas comprises at least one of Argon, Nitrogen, and Helium.

8. A method as recited in claim 1, wherein
   the first feed gas comprises ammonia that is diluted to approximately between 1% and 2% inclusively in the mixture gas that comprises at least one of Argon, Nitrogen, and Helium, and is provided at a flow rate of at least approximately 200 SCCM.

9. A method of fabricating a circuit device having a substrate with a conductive layer formed over the substrate, comprising the steps of:

forming a silicon nitride bottom anti-reflective coating over the conductive layer, wherein the coating is formed by the steps of:

providing a furnace device with a first feed gas comprising ammonia that is carried by a mixture gas comprising at least one of Argon, Nitrogen, and Helium, such that the ammonia comprises no more than approximately 10% of the first feed gas, and providing the furnace device with a second feed gas comprising dichlorosilane in a proportion to the ammonia for forming silicon nitride, the presence of the at least one of Argon, Nitrogen and Helium in the first feed gas providing an increased gas flow rate in the furnace device that increases uniformity of the silicon nitride bottom anti-reflective coating thickness and reduces a temperature gradient within the furnace device.

10. A method as recited in claim 9, wherein the first feed gas is provided to the furnace device at a flow rate of at least approximately 200 SCCM, and the second feed gas is provided to the furnace device at a flow rate of less than approximately 150 SCCM.

11. A method as recited in claim 10, wherein the flow rate of the second feed gas is between approximately 100 and 150 SCCM.

12. A method as recited in claim 9, wherein the first feed gas comprises approximately 1% to 2% ammonia in at least one of Argon, Nitrogen, and Helium, and wherein the first feed gas mixture is provided to the furnace device at a flow rate of approximately between 200 and 500 SCCM.

13. A method as recited in claim 9, wherein the silicon nitride bottom anti-reflective coating is formed within the furnace device at a pressure of approximately 200–350 mTorr.

14. A method as recited in claim 9, wherein the silicon nitride bottom anti-reflective coating is formed to a thickness of between approximately 100 to 600 Angstroms.

15. A method as recited in claim 9, wherein the silicon nitride bottom anti-reflective coating is formed to a thickness of between approximately 150 to 250 Angstroms.

16. A method of fabricating silicon nitride in a furnace unit, comprising the steps of:

providing a gas mixture comprising approximately less than 10% ammonia in at least one of Argon, Nitrogen, and Helium, at a flow rate of at least approximately 200 SCCM, providing a dichlorosilane gas in a proportion to the ammonia for forming silicon nitride at a flow rate that does not exceed approximately 150 SCCM, for at least a portion of a time period that said gas mixture is provided, and maintaining an environmental pressure within the furnace unit that is at least approximately 200 mTorr when said gas mixture and the dichlorosilane gas are provided to the furnace unit, the presence of the at least one of Argon, Nitrogen and Helium in said gas mixture providing an increased gas flow rate in the furnace device that increases uniformity of the silicon nitride thickness and reduces a temperature gradient within the furnace unit.

17. A method as recited in claim 16, further comprising the steps of:

operating the furnace unit at a temperature between approximately 715° C. and 750° C., and at a pressure of less than approximately 350 mTorr when said gas mixture and the dichlorosilane gases are provided to the furnace unit, providing said gas mixture at a flow rate of approximately less than 500 SCCM, wherein ammonia comprises approximately 1% to 2% of said gas mixture, and providing the dichlorosilane gas for at least a portion of a time period that said gas mixture is provided, at a flow rate that is at least approximately 100 SCCM.

18. A method as recited in claim 16, wherein:

the silicon nitride comprises a bottom anti-reflective coating.

* * * * *